(12) United States Patent  
Vadhavania et al.

(10) Patent No.: US 9,324,455 B2  
(45) Date of Patent: Apr. 26, 2016

(54) APPARATUS FOR MEASURING SIGNAL SKEW OF ASYNCHRONOUS FLASH MEMORY CONTROLLER

(71) Applicants: Vishal Vadhavania, Noida (IN); Deepak Jindal, Noida (IN); Anuruddh Sachan, Noida (IN)

(72) Inventors: Vishal Vadhavania, Noida (IN); Deepak Jindal, Noida (IN); Anuruddh Sachan, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 116 days.

(21) Appl. No.: 14/288,362

(22) Filed: May 27, 2014

(65) Prior Publication Data

US 2015/0348648 A1 Dec. 3, 2015

(51) Int. Cl.
  *G11C 29/38* (2006.01)
  *G11C 29/36* (2006.01)
  *G11C 29/02* (2006.01)

(52) U.S. Cl.
  CPC .............. *G11C 29/38* (2013.01); *G11C 29/022* (2013.01); *G11C 29/023* (2013.01); *G11C 29/36* (2013.01)

(58) Field of Classification Search
  CPC .................................................. G01R 31/31937

USPC ................................... 714/700, 724, 814, 815
  See application file for complete search history.

(56) References Cited

U.S. PATENT DOCUMENTS

| | | | |
|---|---|---|---|
| 4,635,256 A * | 1/1987 | Herlein ............ | G01R 31/31713 714/700 |
| 5,231,598 A | 7/1993 | Vlahos | |
| 6,195,772 B1 * | 2/2001 | Mielke ............... | G01R 31/3016 324/73.1 |
| 6,298,465 B1 * | 10/2001 | Klotchkov ........ | G01R 31/31725 327/156 |
| 6,587,976 B1 | 7/2003 | Yun | |
| 6,721,920 B2 | 4/2004 | Rearick | |
| 2005/0063262 A1 * | 3/2005 | Maeda ................. | G11B 7/0956 369/44.32 |

* cited by examiner

*Primary Examiner* — Fritz Alphonse
(74) *Attorney, Agent, or Firm* — Charles E. Bergere

(57) ABSTRACT

A method of measuring skew between signals from an asynchronous integrated flash memory controller (IFC) includes connecting input/output (I/O) pins of the IFC to cycle based test equipment (ATE). The ATE applies a pattern of test signals as input drive to the IFC. Relative to the test cycle, the earliest delay time at which output signals from all of the I/O pins first correspond with expected results, and the latest delay time at which the output signals still correspond with the expected results are measured. The difference between the latest and the earliest delay times is compared with a limit value and a comparison report is generated.

12 Claims, 5 Drawing Sheets

APPARATUS FOR MEASURING SIGNAL SKEW OF ASYNCHRONOUS FLASH MEMORY CONTROLLER

BACKGROUND OF THE INVENTION

The present invention is directed to integrated circuits and, more particularly, to measuring signal skew for an asynchronous flash memory controller.

System designs demand more and more non-volatile memories, either with high density and very high writing throughput for data storage applications or with fast random access for code execution. The flexibility and low cost of flash memory makes it a frequently utilized, well-consolidated and mature technology for most non-volatile memory applications. Electronic devices such as mobile phones, tablets, networking devices, etc. commonly incorporate a processor and flash memory. Typically the processor uses external flash memory, whether or not some flash memory is also included in the processor, since embedded memories can be costly in terms of price and power consumption. Such a processor desirably has an integrated flash memory controller (IFC) that can manage various types of flash memory, such as NAND flash (SLC and MLC), NOR flash, EPROM, and SRAM, where address and data are shared on a bus.

An IFC provides programming and signal interfaces, similar to an enhanced local bus controller, for external flash memory. An asynchronous IFC provides an interface for asynchronous flash memory devices but does not provide a reference clock with the output data signals of the flash memory device.

The specifications for a IFC include restrictions on the skew between multi-bit data and control output signals from the controller, that is to say the variation in the delays of output signals relative to the corresponding input signals. Compliance of products with specifications, including the IFC skew specifications, is checked using automatic test equipment (ATE). Typically an ATE checking skew specifications uses edge searching to measure when a signal edge occurs relative to the test pattern signal, or to a clock signal. In edge searching, the output signal is repeatedly probed (sampled) and compared with the expected result at moments that are later and later in the test cycle until the output signal becomes equal to, or becomes different from, the expected result. Conventional methods of measuring the skew rely on an interface clock. In the absence of such a clock, in the case of a controller for asynchronous flash memory devices, conventional methods involve (n−1) edge searches for n signals and $_nC_2$ measurements, where $_nC_2$ is the number of combinations of n signals taken two at a time. The resulting testing rapidly becomes complex and the test times long. For example, in a device that has a sixteen-bit wide data bus and seven control signals, such a conventional method of measuring the skew would involve twenty-two searches for signals and two hundred and fifty-three data measurements.

Accordingly, it would be advantageous to have a method of measuring signal skew for asynchronous flash memory controllers efficiently with a short test time.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
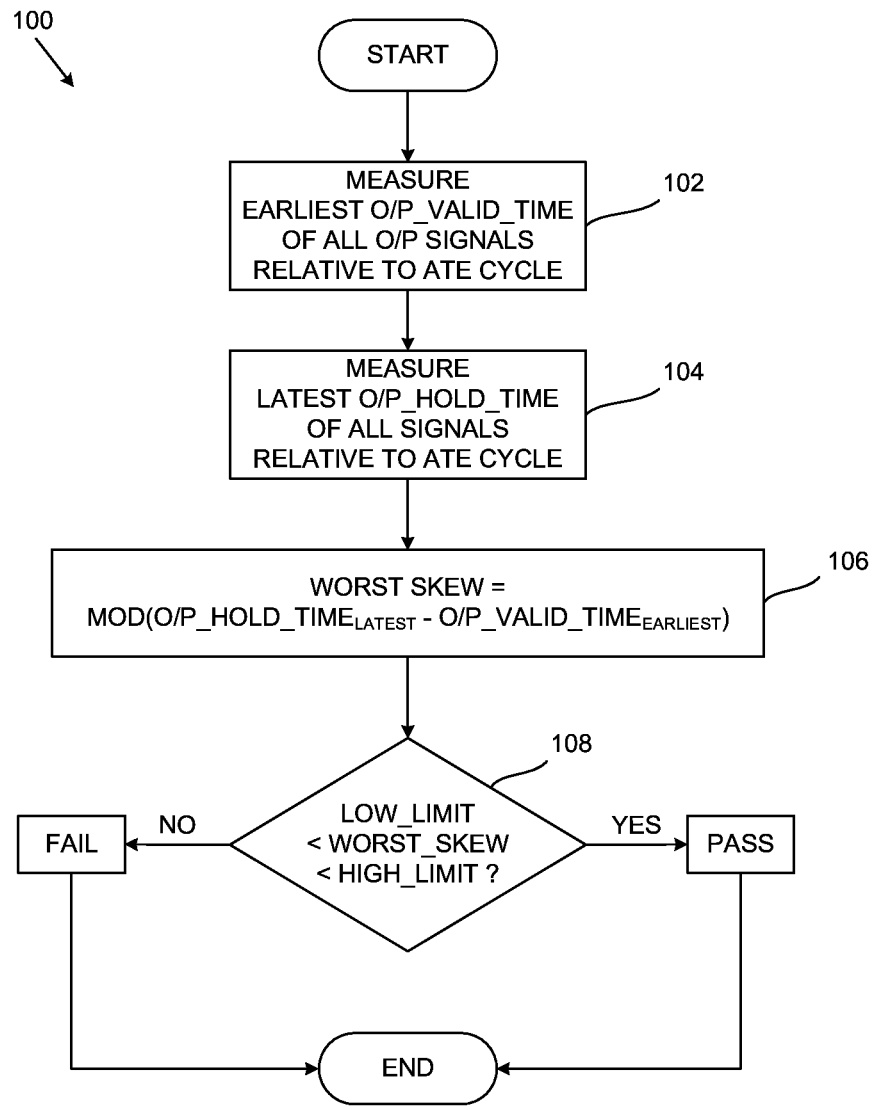
FIG. 1 is a flow chart of a method of measuring skew between signals from an asynchronous flash memory device in accordance with an embodiment of the invention, given by way of example.
Figure 2:
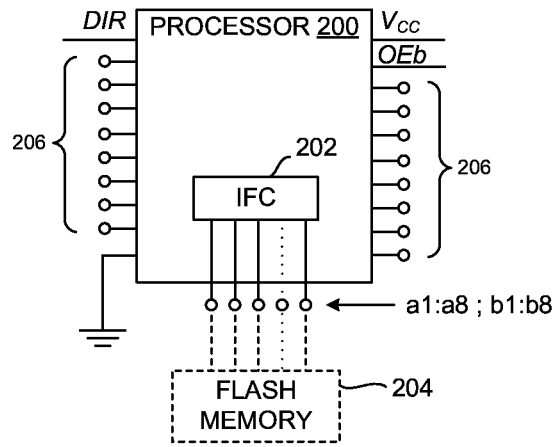
FIG. 2 is a schematic block diagram of a data processor having an integrated flash memory controller.
Figure 3:
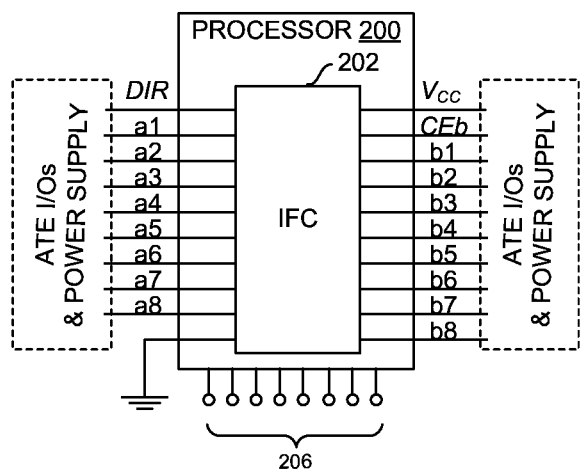
FIG. 3 is a schematic plan view of an the processor of FIG. 2 connected for testing in accordance with the method of FIG. 1.
Figure 9:
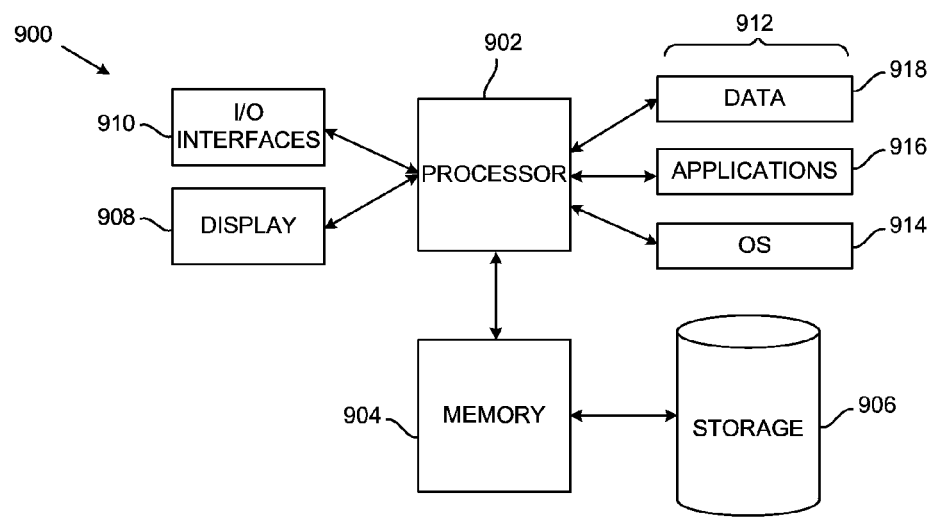
FIG. 9 is a schematic block diagram of an exemplary automatic test equipment for performing the methods of the present invention.
Figure 10:
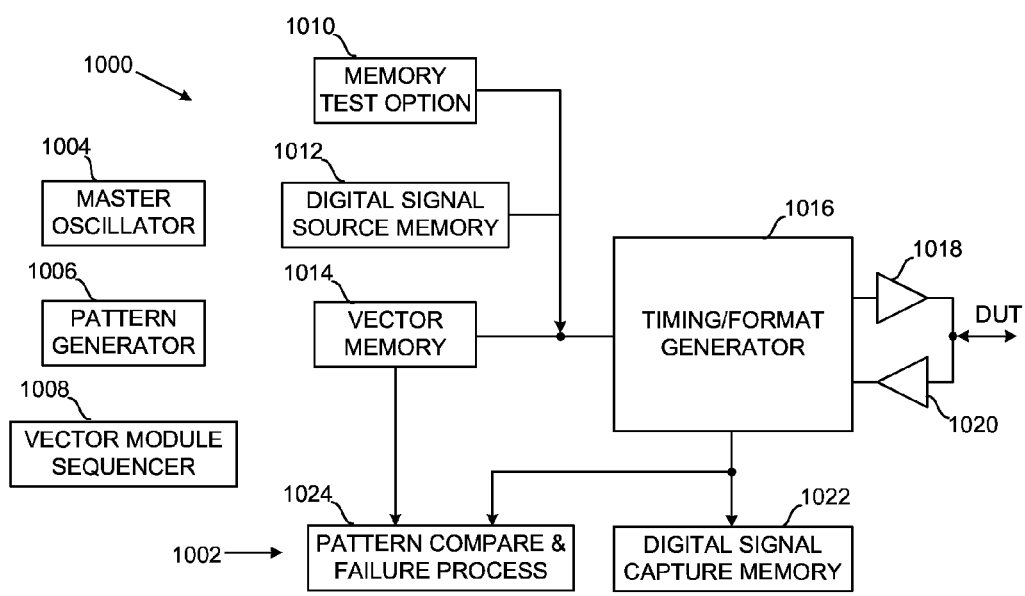
FIG. 10 is a schematic block diagram of modules in the automatic test equipment of FIG. 9.

FIG. 1 is a flow chart illustrating a method 100 of measuring skew between signals from an asynchronous integrated flash memory controller (IFC) 202, in accordance with an embodiment of the invention, given by way of example. The IFC 202 may be part of a processor 200, of which an example is shown in FIG. 2. The method 100 comprises connecting a plurality of input/output (I/O) pins a1 to a8 and b1 to b8 of the IFC 202 to cycle based test equipment 900, an example of which is shown in FIGS. 9 and 10. Typically the test equipment 900 can be of the kind known as automatic test equipment (ATE), although it will be appreciated that some manual input to the ATE will be required for the ATE to operate autonomously.

The test equipment 900 applies a pattern of test signals as input drive to the IFC 200. The earliest delay time $T_{VALID}$ relative to the test cycle at which output signals from all the plurality of I/O pins a1 to a8 and b1 to b8 first correspond with expected results is measured at 102. The latest delay time $T_{HOLD}$ relative to the test cycle at which the output signals from all the plurality of I/O pins a1 to a8 and b1 to b8 still correspond with the expected results is measured at 104. The difference between the latest $T_{HOLD}$ and the earliest $T_{VALID}$ delay times at 106 is compared with a limit value and a report of the comparison is generated at 108.

Embodiments of the invention also include test equipment for measuring skew between signals from a processor 200 having an asynchronous IFC 202, and a non-transitory computer-readable storage medium 904, 906 storing instructions that, when executed by test equipment 900, cause the test equipment to perform a method such as 100 of measuring skew between signals from an asynchronous flash memory processor having an IFC.

The test equipment 900 may provide a reference signal ATE_CLK having a frequency equal to a test cycle of the pattern of test signals, and the delay times may be measured relative to the reference signal.

Measuring the earliest and latest delay times $T_{VALID}$ and $T_{HOLD}$ may include edge searching the output signals from all the plurality of I/O pins a1 to a8 and b1 to b8.

Measuring the latest delay time $T_{HOLD}$ may include measuring the earliest delay time $T_Y$ relative to the test cycle at which an output signal from the plurality of I/O pins a1 to a8 and b1 to b8 no longer corresponds with the expected results, and registering an earlier delay time $T_{HOLD}$ relative to the test cycle at which the output signals from all the plurality of I/O pins still correspond with the expected results. Registering the earlier delay time $T_{HOLD}$ may include subtracting a cycle period $T_{CYC}$ of the test equipment 900 from the earliest delay time $T_Y$ and registering the result of the subtraction.

In more detail, as shown in FIG. 2, the processor 200 has the IFC 202 which can be connected to an asynchronous flash memory module 204 through the I/O pins a1 to a8 and b1 to b8. In addition to the I/O pins a1 to a8 and b1 to b8, the processor 200 has a power supply pin $V_{CC}$, a ground pin and control pins DIR and OEb, and data pins 206.

The processor 200 can be connected as a device under test (DUT) to the ATE 900. For the purposes of testing the IFC 202, ATE is connected to the I/O pins a1 to a8 and b1 to b8, the power supply pin $V_{CC}$, the ground pin and the control pins DIR and OEb. The ATE 900 has a test pattern generator 1000 (FIG. 10) that provides a pattern of test signals as input drive to the I/O pins as well as providing the reference signal ATE_CLK.

Figure 4:
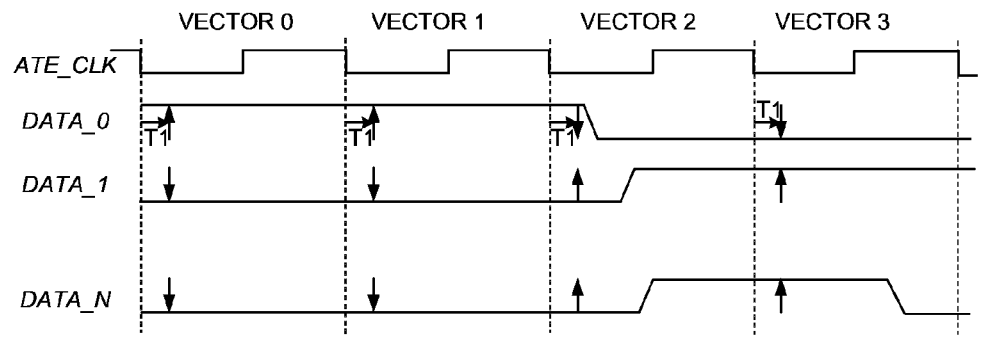
FIGS. 4 to 8 are graphs against time of signals produced by the device under test in performing the method of FIG. 1.
Figure 5:
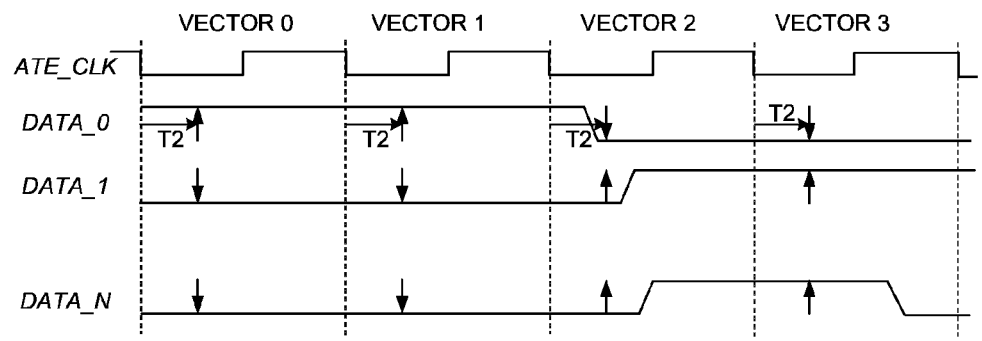
Figure 6:
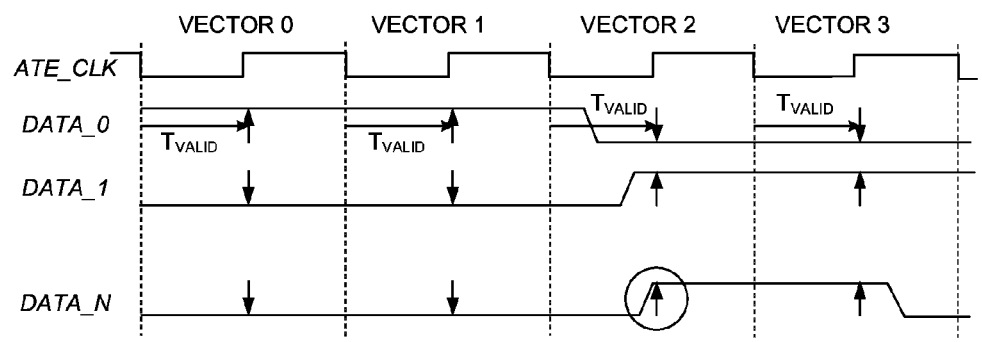
Figure 7:
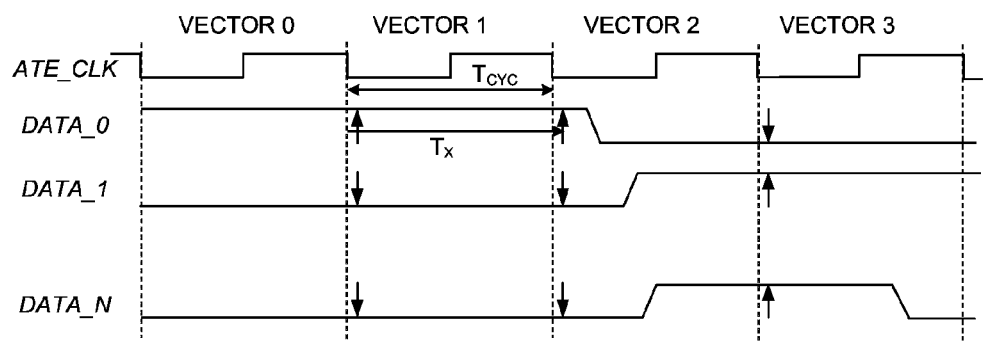
Figure 8:
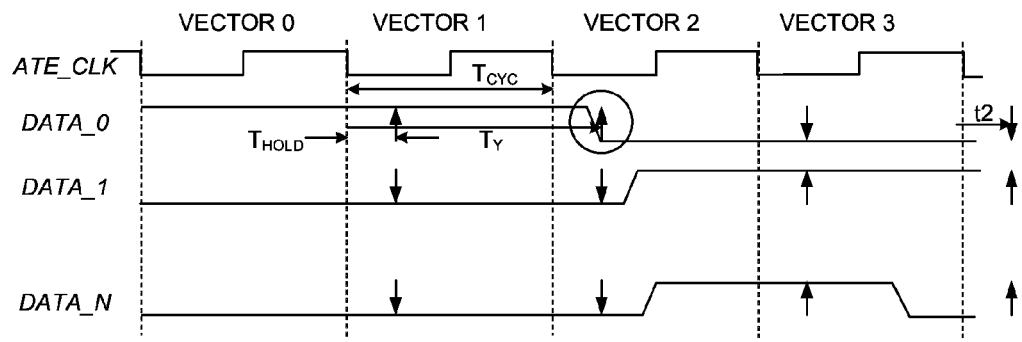

FIGS. 4 to 8 show three signals DATA_0, DATA_1, and DATA_N, representing a simplified version of typical output data changes from all the plurality of IFC I/O pins a1 to a8 and b1 to b8. The delay times are measured relative to the test cycle defined by the reference signal ATE_CLK. The test cycle rate (the frequency of the reference signal ATE_CLK) is chosen to be equal to the expected maximum rate at which the IFC output data can toggle. FIGS. 4 to 6 show measurement of the value $T_{VALID}$ of the earliest delay time EARLIEST_O/P_VALID_TIME of corresponding output data changes of the IFC output signals. FIGS. 7 and 8 show measurement of the value $T_{HOLD}$ of the latest delay time LATEST_O/P_HOLD_TIME of corresponding output data changes of the IFC output signals. The output valid time $T_{VALID}$ is the time taken by the output signal to change state after the input test signal changes state in synchronism with the positive (or negative) edge of the ATE reference (or interface) clock ATE_CLK. Similarly, the output hold time $T_{HOLD}$ is the minimum time for which the output signal maintains that state after the following positive (or negative) edge of the ATE reference (or interface) clock ATE_CLK. In this case, the IFC output signals are probed at moments $T_X$, $T_Y$ that are later by one test cycle duration $T_{CYC}$ than the corresponding hold time, and the hold time $T_{HOLD}$ is then corrected by subtracting the added cycle duration $T_{CYC}$.

The operation of testing is illustrated in FIGS. 4 to 8 by an example of a test pattern where the expected values of the output data signals DATA_0, DATA_1 to DATA_N when probed at times in successive test cycles (of duration $T_{CYC}$) are as shown in the following table, where H signifies a high signal and L signifies a low signal:

|  | DATA_0 | DATA_1 | ... | DATA_N |
| --- | --- | --- | --- | --- |
| VECTOR 0 | H | L | ... | L |
| VECTOR 1 | H | L | ... | L |
| VECTOR 2 | L | H | ... | H |
| VECTOR 3 | L | H | ... | L |
| VECTOR 4 | H | L | ... | L |
| ... | ... | ... | ... | ... |
| VECTOR N | L | L | ... | L |

The technique of edge searching that the ATE uses is illustrated in the drawings by vectors of vertical arrows representing the criteria for passing the specification at the moments in the test cycles when the ATE 900 probes (samples) the IFC output signals and the direction of the arrow represents the result that is expected (asserted for an up arrow or de-asserted for a down arrow, in the case illustrated, respectively high and low). The probe moments are progressively delayed in time in the test cycle until all the IFC output signals probed just achieve the expected result (valid) or almost no longer maintain the expected result (hold).

As shown in FIG. 4, when the probing moment is T1, DATA_0 will fail for vector 2, where the ATE 900 is expecting Low while it captures High. Similarly DATA_1 and DATA_N would also fail. This indicates that none of the DATA pins is meeting the IFC output criteria at time T1. As shown in FIG. 5, the probing moment is then delayed until T2 and the pattern is rerun. DATA_0 and DATA_1 now pass but DATA_N has not passed yet, resulting in overall pattern failure. So, the criteria for an output valid result at T2 are not met by all the signals yet. When the probing moment is delayed until $T_{VALID}$, and the pattern is rerun, even DATA_N just passes the criteria and the value $T_{VALID}$ of the earliest delay time EARLIEST_O/P_VALID_TIME is registered as the IFC output valid time.

For the hold time $T_{HOLD}$, as shown in FIG. 7, when the probing moment is $T_X$, all the IFC output signals DATA_0 to DATA_N still meet the criteria for an output valid result. As shown in FIG. 8, the probing moment is progressively delayed until, at $T_Y$, one of the IFC output signals, DATA_0 fails to meet the criteria for an output valid result. The time $T_Y$ is corrected by subtracting the period $T_{CYC}$ of the ATE clock to arrive at the value $T_{HOLD}$ of the latest delay time LATEST_O/P_HOLD_TIME, which is the last previous probing moment when the IFC output signals DATA_0 to DATA_N still meet the criteria.

The signal DATA_1 has a skew relative to the signal DATA_0 and a skew relative to the signal DATA_N that is intermediate between the skew as measured between $T_{VALID}$ of DATA_N and $T_{HOLD}$ of DATA_0 and it is unnecessary to measure the skew between the signal DATA_1 and the other signals DATA_0 and DATA_N. It will be appreciated that, although the method is illustrated as applied to three signals for simplicity, the method can be applied to greater numbers of signals. For a device that has a sixteen-bit wide data bus and seven control signals, a conventional method of measuring the skew would involve twenty-two searches for signals and two hundred and fifty-three data measurements. With the method 100, no signal searches and only two data measurements are needed, representing a big saving in test time.

FIG. 9 is a schematic block diagram of an ATE 900 in accordance with an embodiment of the present invention for performing the methods of the present invention described above. The ATE 900 includes a processor 902 coupled to a memory 904 and additional memory or storage 906 coupled to the memory 904. The ATE 900 also includes a display device 908, input/output interfaces 910, and software 912. The software 912 includes operating system software 914, applications programs 916, and data 918. The applications programs 916, memory 904 and storage 906 can include, among other things, a test pattern generator 1000, and a delay measurement module and comparison module 1002, illustrated in FIG. 10. The EDA tool 900 generally is known in the art except for the software used to implement the method described above regarding measuring skew between signals from an asynchronous flash memory processor having an IFC. When software or a program is executing on the processor 902, the processor becomes a "means-for" performing the steps or instructions of the software or application code running on the processor 902. That is, for different instructions and different data associated with the instructions, the internal circuitry of the processor 902 takes on different states due to different register values, and so on, as is known by those of skill in the art. Thus, any means-for structures described herein relate to the processor 902 as it performs the steps of the methods disclosed herein.

As shown in FIG. 10, the test pattern generator 1000 includes a master oscillator 1004, a pattern generator 1006, a vector module sequencer 1008, an element 1010 enabling options to be selected for the memory test, a digital signal source memory 1012, a vector memory 1014 and a timing/format generator 1016 connected to the I/O pins a1 to a8 and b1 to b8 individually through respective output and input buffer amplifiers such as 1018 and 1020 (only one of each being shown for simplicity).

The delay measurement module and comparison module 1002 includes a digital signal capture memory 1022 and a pattern compare and failure process module 1024.

The invention may be implemented at least partially in a non-transitory machine-readable medium containing a computer program for running on a computer system, the program at least including code portions for performing steps of a method according to the invention when run on a programmable apparatus, such as a computer system or enabling a programmable apparatus to perform functions of a device or system according to the invention.

The computer program may be stored internally on computer readable storage medium or transmitted to the computer system via a computer readable transmission medium. All or some of the computer program may be provided on non-transitory computer-readable media permanently, removably or remotely coupled to an information processing system. The computer-readable media may include, for example and without limitation, any number of the following: magnetic storage media including disk and tape storage media; optical storage media such as compact disk media (for example, CD ROM, CD R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM and so on; and data transmission media including computer networks, point-to-point telecommunication equipment, and carrier wave transmission media, just to name a few.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on non-transitory computer readable media permanently, removably or remotely coupled to an information processing system. The computer readable media may include, for example and without limitation, any number of the following: magnetic storage media including disk and tape storage media; optical storage media such as compact disk media (for example CDROM, CDR) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM; and data transmission media including computer networks, point-to-point telecommunication equipment, and carrier wave transmission media, just to name a few.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A tester for measuring skew between signals from an asynchronous integrated flash memory controller (IFC) having a plurality of input/output (I/O) pins, the tester comprising:
   a test pattern generator for providing a cyclical pattern of test signals as input drive to the I/O pins;
   a delay measurement module for measuring the earliest delay time relative to the test cycle at which output signals from all the plurality of I/O pins first correspond with expected results and the latest delay time relative to the test cycle at which the output signals from all the plurality of I/O pins still correspond with the expected results; and
   a comparison module for comparing with a limit value the difference between the latest and the earliest delay times and generating a report of the comparison,
   wherein the delay measurement module measuring the latest delay time includes:
      measuring the earliest delay time relative to the test cycle at which an output signal from the plurality of I/O pins no longer corresponds with the expected results, and
      saving an earlier delay time relative to the test cycle at which the output signals from all the plurality of I/O pins still correspond with the expected results.

2. The tester of claim 1, wherein the test pattern generator provides a reference signal having a frequency equal to a test cycle of the pattern of test signals, and the delay measurement module measures the delay times relative to the reference signal.

3. The tester of claim 1, wherein the delay measurement module measuring the earliest and latest delay times includes edge searching the output signals from all the plurality of I/O pins.

4. The tester of claim 1, wherein the delay measurement module registering the earlier delay time includes subtracting a cycle period of the test equipment from the earliest delay time and registering the result of the subtraction.

5. A method of measuring skew between signals from an asynchronous integrated flash memory controller (IFC), the method comprising:
   connecting a plurality of input/output (I/O) pins of the IFC to a cycle based test equipment;
   applying a cyclical pattern of test signals as an input to drive to the IFC, using the test equipment;
   measuring the earliest delay time relative to the test cycle at which output signals from all of the plurality of I/O pins first correspond with expected results;
   measuring the latest delay time relative to the test cycle at which the output signals from all of the plurality of I/O pins still correspond with the expected results; and
   comparing with a limit value the difference between the latest and the earliest delay times and generating a report of the comparison,
   wherein measuring the latest delay time includes measuring the earliest delay time relative to the test cycle at which an output signal from the plurality of I/O pins no longer corresponds with the expected results, and saving an earlier delay time relative to the test cycle at which the output signals from all the plurality of I/O pins still correspond with the expected results.

6. The method of claim 5, wherein the test equipment provides a reference signal having a frequency equal to a test cycle of the pattern of test signals, and the delay times are measured relative to the reference signal.

7. The method of claim 5, wherein measuring the earliest and latest delay times includes edge searching the output signals from all the plurality of I/O pins.

8. The method of claim 5, wherein registering the earlier delay time includes subtracting a cycle period of the test equipment from the earliest delay time and registering the result of the subtraction.

9. A non-transitory computer-readable storage medium storing instructions that, when executed by test equipment connected to a plurality of input/output (I/O) pins of an asynchronous integrated flash memory controller (IFC), cause the test equipment to perform a method of measuring skew between signals from the IFC, the method comprising:
   the test equipment applying a cyclical pattern of test signals as input drive to the IFC;
   measuring the earliest delay time relative to the test cycle at which output signals from all the plurality of I/O pins first correspond with expected results;
   measuring the latest delay time relative to the test cycle at which the output signals from all the plurality of I/O pins still correspond with the expected results; and
   comparing with a limit value the difference between the latest and the earliest delay times and generating a report of the comparison, and
   wherein measuring the latest delay time includes the test equipment measuring the earliest delay time relative to the test cycle at which an output signal from the plurality of I/O pins no longer corresponds with the expected results, and saving an earlier delay time relative to the test cycle at which the output signals from all the plurality of I/O pins still correspond with the expected results.

10. The non-transitory computer-readable storage medium of claim 9, wherein the test equipment provides a reference signal having a frequency equal to a test cycle of the pattern of test signals, and the delay times are measured relative to the reference signal.

11. The non-transitory computer-readable storage medium of claim 9, wherein measuring the earliest and latest delay times includes the test equipment edge searching the output signals from all the plurality of I/O pins.

12. The non-transitory computer-readable storage medium of claim 9, wherein registering the earlier delay time includes the test equipment subtracting a cycle period of the test equipment from the earliest delay time and registering the result of the subtraction.

* * * * *